United States Patent [19]

Stadler et al.

[11] Patent Number: 5,451,267
[45] Date of Patent: Sep. 19, 1995

[54] PROCESS FOR THE WET-CHEMICAL TREATMENT OF DISK-SHAPED WORKPIECES

[75] Inventors: Max Stadler, Haiming; Günter Schwab, Emmerting; Peter Romeder, Burghausen, all of Germany

[73] Assignee: Wacker Chemitronic Gesellschaft für Elektronik-Grundstoffe mbH, Burghausen, Germany

[21] Appl. No.: 240,986

[22] Filed: May 11, 1994

[30] Foreign Application Priority Data

May 13, 1993 [DE] Germany .................. 43 16 096.4

[51] Int. Cl.⁶ .......................................... H01L 21/306
[52] U.S. Cl. .............................................. 134/30; 134/36
[58] Field of Search ..................... 134/26, 30, 34, 36

[56] References Cited

U.S. PATENT DOCUMENTS

| | | | |
|---|---|---|---|
| 4,687,523 | 8/1987 | Hall et al. | 134/30 |
| 4,840,701 | 6/1989 | Stern | 156/637 |
| 4,840,701 | 6/1989 | Stern | 156/637 |
| 5,014,727 | 5/1991 | Algo | 134/102 |
| 5,261,966 | 11/1993 | Mashimo et al. | 134/26 |

FOREIGN PATENT DOCUMENTS

| | | |
|---|---|---|
| 0417507 | 8/1925 | Germany . |
| 3805076 | 8/1989 | Germany . |
| 2228424 | 8/1990 | United Kingdom . |

OTHER PUBLICATIONS

Patent Abstracts of Japan, JP57065325 Apr. 1982.
Patent Abstracts of Japan, 63-159640 Mar. 1990.
Patents Abstracts of Japan E-905 Mar. 19, 1990, vol. 14/No. 145 "Washing Device for Semiconductor Substrate with Water", NEC Kyush Ltd.
Patent Abstracts of Japan C-117, Aug. 3, 1982, vol. 6, No. 143.

*Primary Examiner*—Scott Kastler
*Attorney, Agent, or Firm*—Collard & Roe

[57] ABSTRACT

A process for the wet-chemical treatment of workpieces, especially of semiconductor wafers, includes exposing the workpieces to a flow of a gassified treatment medium generated by homogeneously dispersing gas bubbles in a liquid.

9 Claims, 1 Drawing Sheet

PROCESS FOR THE WET-CHEMICAL TREATMENT OF DISK-SHAPED WORKPIECES

BACKGROUND OF THE INVENTION

1. Field of the Invention

The present invention relates to a process for the wet-chemical treatment of workpieces, especially of semiconductor wafers, by exposing the workpieces to a flow of a gassified treatment medium.

2. The Prior Art

U.S. Pat. No. 5,014,727 discloses an apparatus with which semiconductor wafers can be washed. The semiconductor wafers are stacked in a supporting frame without touching one another. The supporting frame is immersed in a trough containing washing liquid. A pump pumps liquid overflowing from the trough back into the trough through the trough base via a filter, so that the semiconductor wafers are exposed to a flow of the liquid. Situated underneath the supporting frame on the trough base is a bubble generator with which gas bubbles are blown into the liquid for the purpose of mixing.

A disadvantage of this apparatus and the process which can be carried out therewith is that the distribution of the gas bubbles in the liquid is not homogeneous and therefore results in locally different flow conditions. The washing liquid consequently flows around the semiconductor wafers non-uniformly, and with varying intensity. This results in non-uniform treatment of the workpiece surfaces and an undesirable position-dependent success of the treatment, especially if, in addition to a cleaning action of the treatment, a material-removing etch treatment is provided by the liquid and/or the gas.

SUMMARY OF THE INVENTION

It is an object of the present invention to provide a process with which the disadvantages described above can be reliably avoided and which ensures uniform wet-chemical treatment at every point on the surface of the workpieces, in particular of semiconductor wafers.

The above object is accomplished according to the present invention by providing a process for the wet-chemical treatment of workpieces, especially of semiconductor wafers, by exposing the workpiece to a flow of a gassified treatment medium, which process comprises generating the treatment medium by homogeneously dispersing gas bubbles in the liquid.

In the context of the invention, "homogeneously dispersed" means that the concentration of gas bubbles in the liquid is virtually identical in any sample volume, selected in random-sample fashion, of the treatment medium. Furthermore, it has been found particularly advantageous to ensure that the gas bubbles dispersed in the liquid are as small as possible, so that they are subject only to a very low buoyant force and their relative velocity with respect to the liquid in relation to the velocity component in the direction of the workpiece is therefore zero, or virtually zero.

Very effective apparatuses for generating suitable treatment media in the context of the invention are feed pumps which are able to propel gases and liquids. If both a gas and a liquid are supplied to such a pump on the intake side, an intensive mixing of the gas and the liquid takes place in the pump. The pump then delivers a homogeneous dispersion of very fine gas bubbles in the liquid on the delivery side. Compared with a liquid into which a bubble generator ("bubbler") forces bubbles, this treatment medium exhibits modified properties. Whereas in the latter case the gas bubbles whirl through the liquid and mix it in doing so, local flow differences which effect this no longer occur in the case of the homogeneously dispersed gas bubbles. An additional mixing of the liquid is also no longer necessary in this case, since the liquid has already been adequately mixed by the dispersion of the gas.

This difference manifests itself especially in the wet-chemical treatment of semiconductor wafers. As uniform a treatment as possible of the workpiece surfaces is necessary, for example, in the cleaning of semiconductor wafers and especially if a material-removing effect is to be achieved by the wet-chemical treatment, as is the case in the wet-chemical etching of semiconductor wafers. Thus, it frequently happens that damaged regions in the crystal lattice close to the surface have to be removed after expensive shaping steps, such as, for example, lapping, grinding, or edge rounding of semiconductor wafers. The process according to the invention then reliably ensures that the material removal takes place uniformly and the wafer geometry established by the mechanical shaping remains unaltered.

Although the process is provided especially for the wet-chemical treatment of semiconductor wafers, its application is not limited to such workpieces. Its advantages can also be achieved, for example, in the wet-chemical treatment of glass and plastics materials if an especially uniform treatment is necessary. Furthermore, it was surprisingly found that semiconductor workpieces are wet-chemically cleaned and/or etched with a significantly enhanced rate, if the treatment medium is generated according to the present invention.

Therefore, semiconductor wafers, as well as other semiconductor workpieces, e.g., semiconductor crystal rods, granular semiconductor material, lumpy semiconductor material and shaped semiconductor bodies, are advantageously treated in the claimed process.

Especially suitable feed pumps for carrying out the process are pumps in which the treatment liquid fed is intensely accelerated. Preferably, centrifugal pumps or axial-flow pumps are used.

Water or known aqueous cleaning solutions or aqueous etching solutions are the liquids preferably used. Furthermore, it is preferable to add a surfactant to the liquid used, preferably in a concentration of 0.05% to 1% by volume, based upon the total volume of the liquid. The surfactant has a stabilizing effect on the gas bubbles and prolongs the time which elapses on average before individual gas bubbles combine to form larger gas bubbles. Suitable examples of surfactants include anionic surfactants such as sulfates, sulfonates or soaps, cationic surfactants such as quaternary ammonium components, and non-ionic surfactants such as polyethylene glycol ethers.

Suitable gases which are homogeneously dispersed in the liquid are, for example, an inert gas such as nitrogen, or a reactive gas, such as air, oxygen, ozone, hydrogen fluoride, or hydrogen chloride, nitrous oxide or nitric oxide, or any mixtures of these gases. The amount of gas to be dispersed in the liquid ranges from 5% to 50% by volume, preferably from 10% to 40% by volume, and most preferably from 15% to 30% by volume based upon the total volume of the liquid.

In the preferred embodiment of the process, semiconductor wafers are subjected to a wet-chemical treatment during which the surfaces of the semiconductor wafers undergo a uniform material removal. In the simplest case, the liquid has the material-removing effect of an etching solution. The possibility is not, however, excluded that the liquid and the gas develop this effect only in combination. The treatment medium delivered by the pump is introduced into a treatment chamber via at least one inlet, and specifically in such a way that the semiconductor wafers to be treated are exposed to a flow of the treatment medium, that is to say, the feed jet of the pump is directed at the semiconductor wafers. For this purpose, the semiconductor wafers are contained in a supporting frame with whose aid they can be held in the treatment medium and which makes possible free access of the treatment medium to the semiconductor surfaces. The treatment chamber is first filled with the treatment medium to such an extent that the semiconductor wafers can be completely immersed in it. It is then advisable to remove as much treatment medium via an overflow from the treatment chamber as is immediately fed in again via the inlet. The treatment medium leaving the treatment chamber is collected in a feedstock container, expediently filtered and then fed back to the feed pump again, thereby resulting in a circuit for the treatment medium. Since at least a part of the gas is escaping the treatment medium after it leaves the treatment chamber, a corresponding part of fresh gas is dispersed in the treatment medium before the treatment medium is fed again into the treatment chamber.

BRIEF DESCRIPTION OF THE DRAWINGS

Other objects and features of the present invention will become apparent from the following detailed description considered in connection with the accompanying drawings which disclose an embodiment of the present invention. It should be understood, however, that the drawing is designed for the purpose of illustration only and not as a definition of the limits of the invention. A comparison example in which semiconductor wafers have been treated with an etchant which effects a material removal is compared below with an example of the treatment of semiconductor wafers according to the invention.

In the drawings, wherein similar reference characters denote similar elements throughout the several views.

COMPARISON EXAMPLE

Figure 1A:
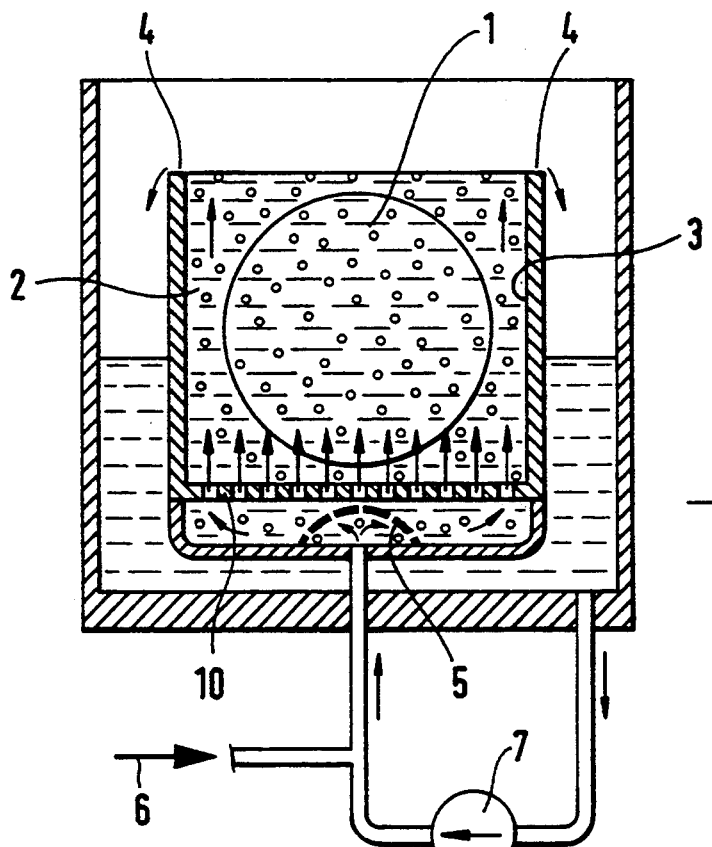
FIG. 1a shows diagrammatically the experimental setup of the comparison example.

In an apparatus in accordance with FIG. 1a, which comprises a treatment chamber 3 having a perforated chamber base, 10 silicon wafers having a diameter of 150 mm were subjected to a treatment with an aqueous etchant containing 10% by volume for the gas hydrogen fluoride, 20% by weight nitric acid and 0.5% by volume for the ionic surfactant. For this purpose, the silicon wafers 1, which were contained in a supporting frame not shown in the figure, were immersed in the etchant 2. During the wafer treatment, a centrifugal pump 7 fed etchant as replenishment into the treatment chamber 3 via a distributor strip 5 mounted beneath the chamber base. The etchant draining from the treatment chamber via the overflow 4 was fed to the intake side of the pump. The etchant contained in the treatment chamber was gassified by feeding a constant stream of nitrogen 6 into the etchant circuit between the pump outlet and the distributor strip to produce 10% by volume nitrogen.

EXAMPLE (INVENTION)

Figure 1B:
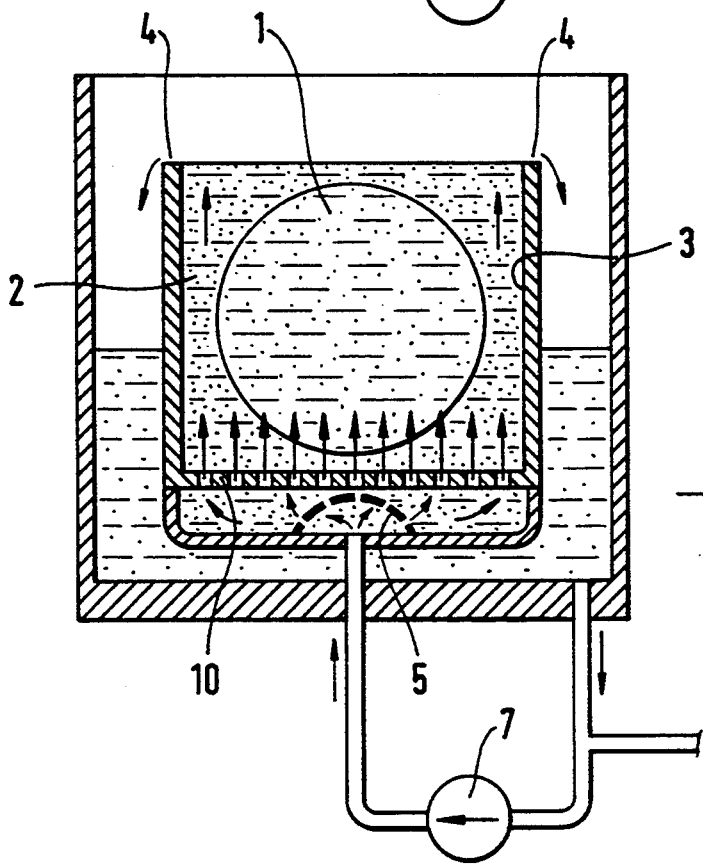
FIG. 1b shows the corresponding setup in the experiment for an example according to the invention.

An additional 10 silicon wafers having a diameter of 150 mm were treated using the apparatus described in the comparison example. The composition of the etchant, the pump speed and the rate at which nitrogen was added remained unaltered compared with the comparison example. According to FIG. 1b, in contrast to FIG. 1a, the nitrogen 6 was fed to the intake side of the centrifugal pump 7. It was found that, for comparable material removal, an etching rate which was two to three times higher than in the wafer treatment according to the comparison example was achieved with the wafer treatment according to the invention.

The treated wafers of both experiments were investigated for the material removal which had occurred. Furthermore, the planarity of the wafers, i.e., the deviation of the real surface from an ideally flat surface, was determined as geometrical parameter and quantified as so-called local thickness variation LTV. The plane parallel to the back of the wafer with the wafer lying on a flat vacuum holder in the vacuum turned on state was used as reference plane. The $LTV_{max}$ values revealed in the table indicate the greatest local deviations in the planarity which were found in the investigation of a wafer surface, the surface of each wafer being divided into 69 square areas ("sites") having a side length of 15 mm as local measuring regions. The comparison of the measured values of the two examples shows a dramatic improvement in the planarity in the case of the treatment of the silicon wafers in accordance with the invention.

TABLE

| Wafer No. | Comparison Example | | Invention Example | |
|---|---|---|---|---|
| | Material Removal ($\mu$m) | $LTV_{max}$ ($\mu$m) | Material removal ($\mu$m) | $LTV_{max}$ ($\mu$m) |
| 1 | 30.52 | 4.76 | 30.20 | 0.12 |
| 2 | 31.31 | 5.22 | 30.25 | 0.22 |
| 3 | 30.09 | 4.96 | 30.12 | 0.22 |
| 4 | 30.91 | 5.72 | 30.17 | 0.15 |
| 5 | 32.13 | 5.31 | 30.22 | 0.25 |
| 6 | 30.25 | 4.98 | 30.25 | 0.08 |
| 7 | 33.14 | 5.12 | 30.16 | 0.02 |
| 8 | 32.29 | 5.65 | 30.16 | 0.15 |
| 9 | 32.63 | 5.29 | 30.08 | 0.21 |
| 10 | 31.58 | 5.37 | 30.27 | 0.17 |

While only a single embodiment of the present invention has been shown and described, it is to be understood that many changes and modifications may be made thereunto without departing from the spirit and scope of the invention as defined in the appended claims.

What is claimed is:

1. A process for the wet-chemical treatment of semiconductor workpieces comprising exposing said workpieces to a flow of a gassified treatment medium, and intensively mixing a gas and a liquid in a feed pump, said feed pump delivering a homogeneous dispersion of very fine gas bubbles in said liquid as said gassified treatment medium to which said workpieces are exposed.

2. Process according to claim 1, comprising generating said propelled treatment medium by a feed pump which homogeneously disperses the gas bubbles in the propelled liquid, said feed pump having an intake side; and feeding the gas into the liquid at the intake side of the pump.

3. Process according to claim 1, wherein a relative velocity of the gas bubbles and of the liquid in the propelled treatment medium in relation to a velocity component in the direction of the workpieces is zero or approximately zero.

4. Process according to claim 1, wherein said workpieces are silicon wafers.

5. Process according to claim 1, wherein the amount of gas to be dispersed ranges from 5% to 50% by volume based upon the total volume of the liquid.

6. Process according to claim 1, comprising selecting said liquid from the group consisting of water, an aqueous cleaning solution and an aqueous etching solution.

7. Process according to claim 1, wherein said liquid contains from 0.05% to 1% by volume of a surfactant based upon the total volume of the liquid.

8. Process according to claim 1, comprising selecting said gas from the group consisting of inert gas, air, oxygen, ozone, hydrogen fluoride, hydrogen chloride, nitrous oxide and nitric oxide.

9. Process according to claim 1, comprising selecting said semiconductor workpieces from the group consisting of semiconductor wafers, semiconductor crystal rods, granular semiconductor material, lumpy semiconductor material and shaped semiconductor bodies.

* * * * *